United States Patent [19]

Blanchard

[11] Patent Number: 5,034,785
[45] Date of Patent: Jul. 23, 1991

[54] PLANAR VERTICAL CHANNEL DMOS STRUCTURE

[75] Inventor: Richard Blanchard, Los Altos, Calif.

[73] Assignee: Siliconix Incorporated, Santa Clara, Calif.

[21] Appl. No.: 235,842

[22] Filed: Aug. 24, 1988

Related U.S. Application Data

[60] Continuation-in-part of Ser. No. 929,685, Nov. 13, 1986, abandoned, which is a division of Ser. No. 843,454, Mar. 24, 1986, Pat. No. 4,767,722.

[51] Int. Cl.[5] .......................................... H01L 29/78
[52] U.S. Cl. .................................. 357/23.4; 357/23.1; 357/41; 357/45; 357/55
[58] Field of Search ................. 357/55, 45, 23.4, 23.1, 357/23.4, 23.6, 23.9, 23.11, 23.13, 41, 56, 59 E, 59 H

[56] References Cited

U.S. PATENT DOCUMENTS

| | | | |
|---|---|---|---|
| 4,455,740 | 6/1984 | Iwai | 357/55 |
| 4,509,249 | 4/1985 | Goto et al. | 29/576 W |
| 4,520,552 | 6/1985 | Arnould et al. | 357/59 G |
| 4,546,367 | 10/1985 | Schutten et al. | 357/23.4 |
| 4,630,088 | 12/1986 | Ogura et al. | 357/23.4 |
| 4,631,803 | 12/1986 | Hunter et al. | 357/50 |
| 4,636,281 | 1/1987 | Buiguez et al. | 357/55 |
| 4,663,644 | 5/1987 | Shimizu | 357/23.4 |
| 4,767,722 | 8/1988 | Blanchard | 357/23.4 |
| 4,893,160 | 1/1990 | Blanchard | 357/23.4 |
| 4,914,058 | 4/1990 | Blanchard | 357/23.4 |
| 4,949,138 | 8/1990 | Nishimura | 357/23.6 |

FOREIGN PATENT DOCUMENTS

| | | | |
|---|---|---|---|
| 0159663 | 10/1985 | European Pat. Off. | |
| 0164095 | 11/1985 | European Pat. Off. | 357/23.4 |
| 2438342 | 10/1979 | France | |
| 0065463 | 5/1980 | Japan | 357/55 |
| 0108325 | 6/1984 | Japan | 29/576 W |
| 0226185 | 11/1985 | Japan | 357/23.4 |
| 0161766 | 7/1986 | Japan | 357/55 |
| 0115775 | 5/1987 | Japan | 357/23.4 |
| 0114248 | 5/1988 | Japan | 357/23.6 |
| 0037058 | 2/1989 | Japan | 357/23.11 |

OTHER PUBLICATIONS

Ueda et al., "A New Vertical Power MOSFET Structure with Extremely Reduced On-Resistance", IEEE Trans. on Electron Devices, vol. ED-32, No. 1, 1/1985, pp. 2-6.

Chang et al., "Self-Aligned. . . of 1 mr. cm$^2$", IEEE, vol. ED-34, No. 11, Nov. 1987.

Ueda et al., "A New Injection Suppression Structure for Conductivity Modulated Power MOSFETS", Confer. on Solid State Devices & Materials, Tokyo, 1986, pp. 97-100.

*Primary Examiner*—Rolf Hille
*Assistant Examiner*—Minhloan Tran
*Attorney, Agent, or Firm*—Skjerven, Morrill, Macpherson, Franklin & Friel

[57] ABSTRACT

A DMOS power transistor has a vertical gate and a planar top surface. A vertical gate fills a rectangular groove lined with a dielectric material which extends downward so that source and body regions lie on each side of the dielectric groove. Carriers flow vertically between source and body regions and the structure has a flat surface for all masking steps.

18 Claims, 6 Drawing Sheets

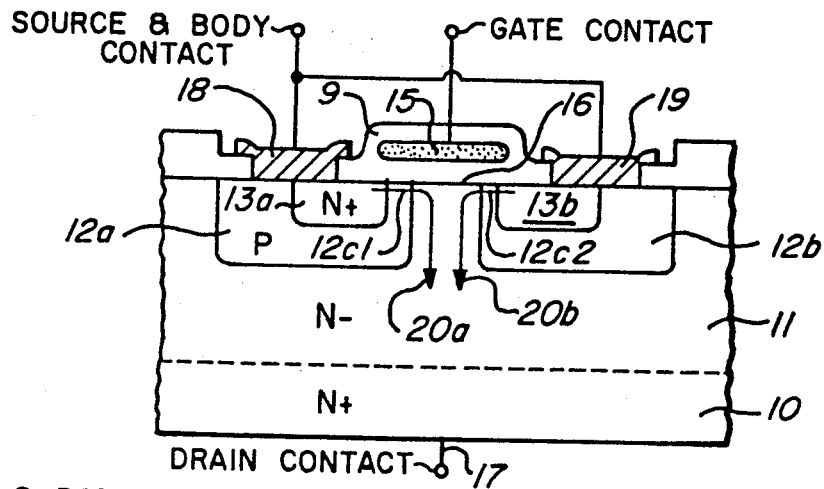
FIG._1 (PRIOR ART)
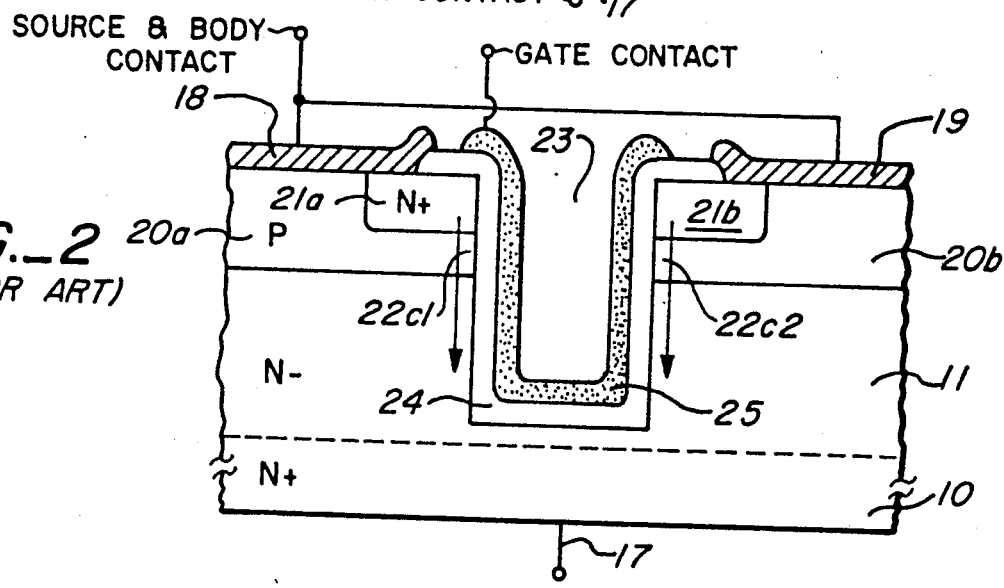
FIG._2 (PRIOR ART)
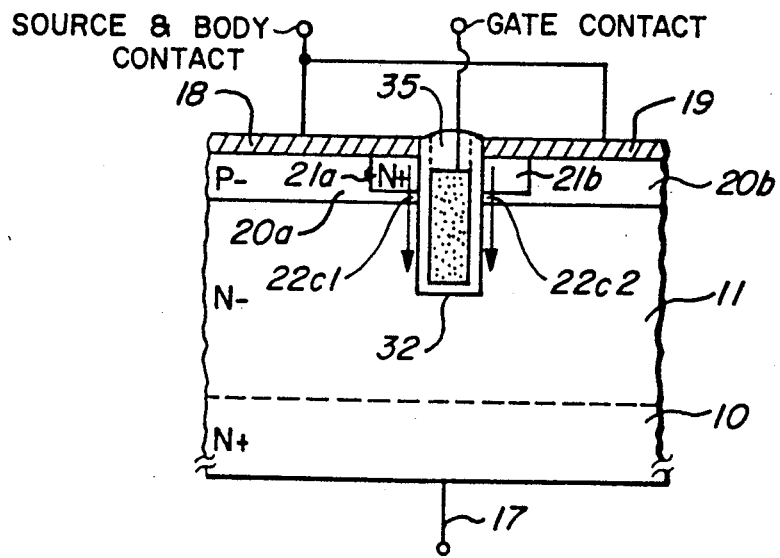
FIG._3

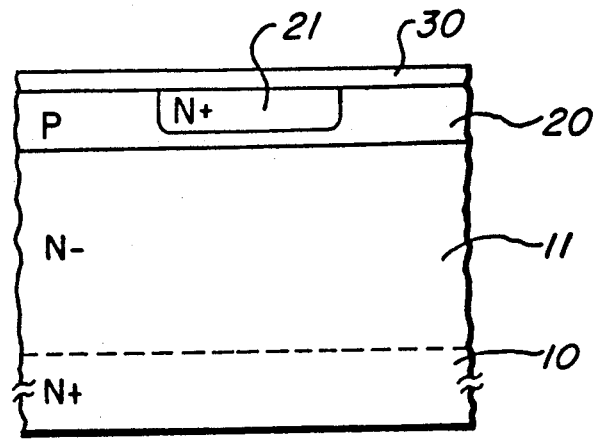
FIG._4a
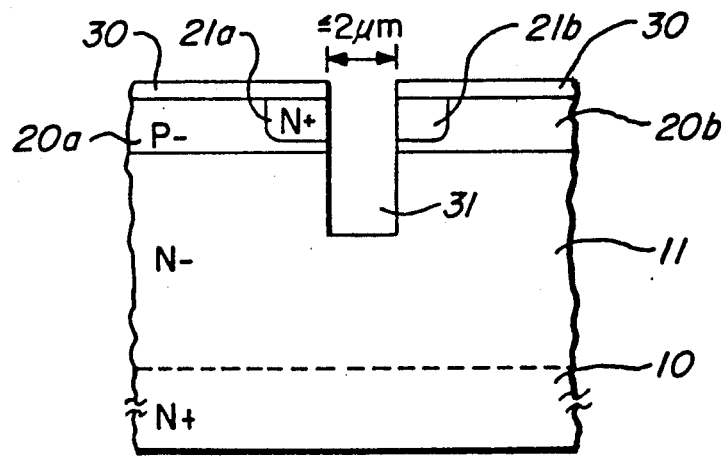
FIG._4b
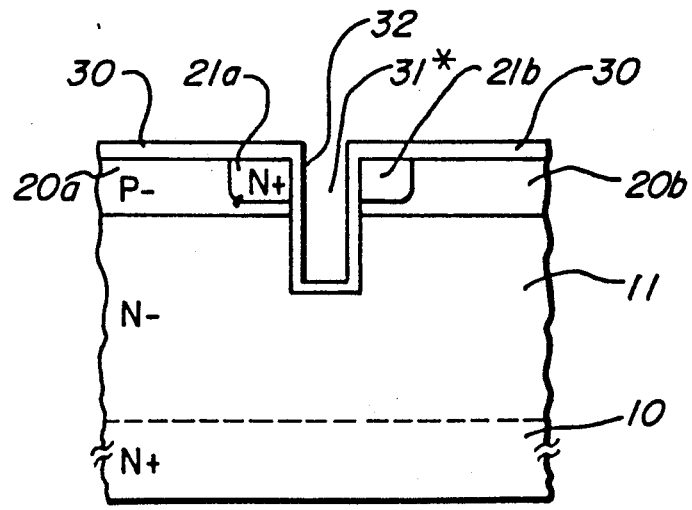
FIG._4c

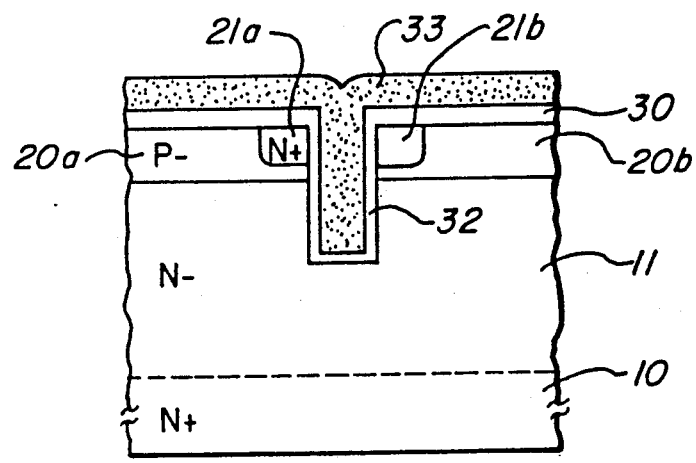
FIG._4d
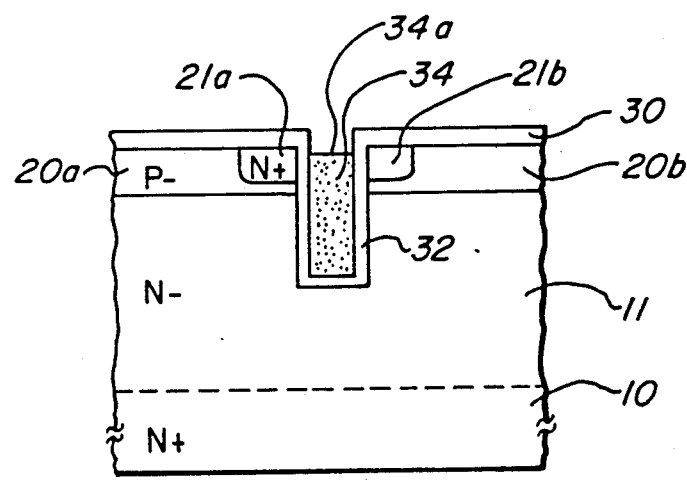
FIG._4e
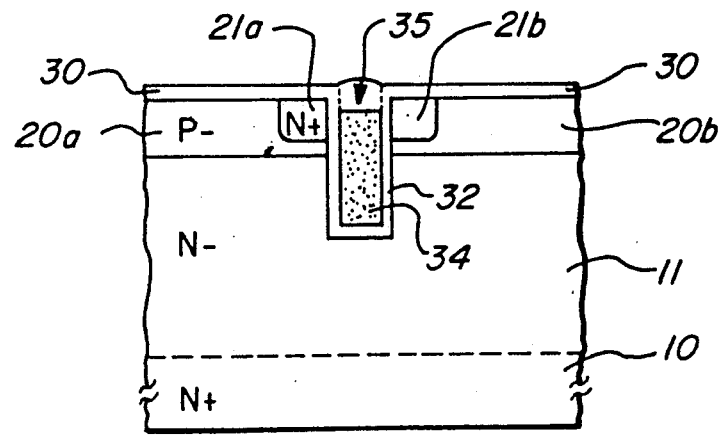
FIG._4f

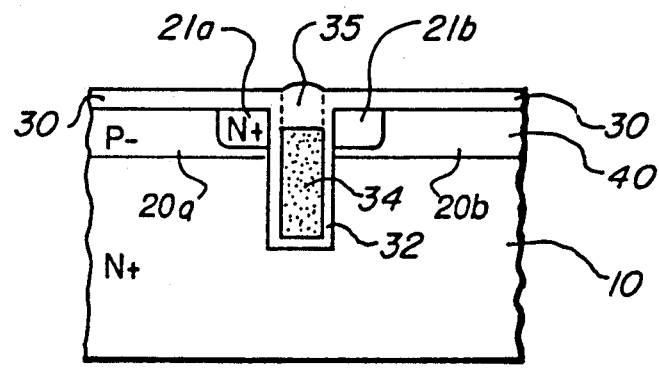
FIG._5
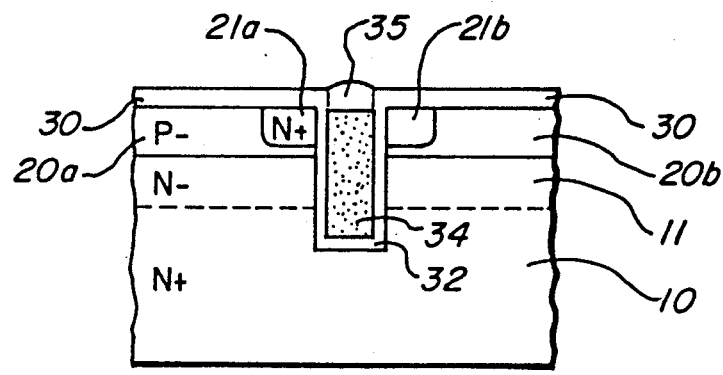
FIG._6
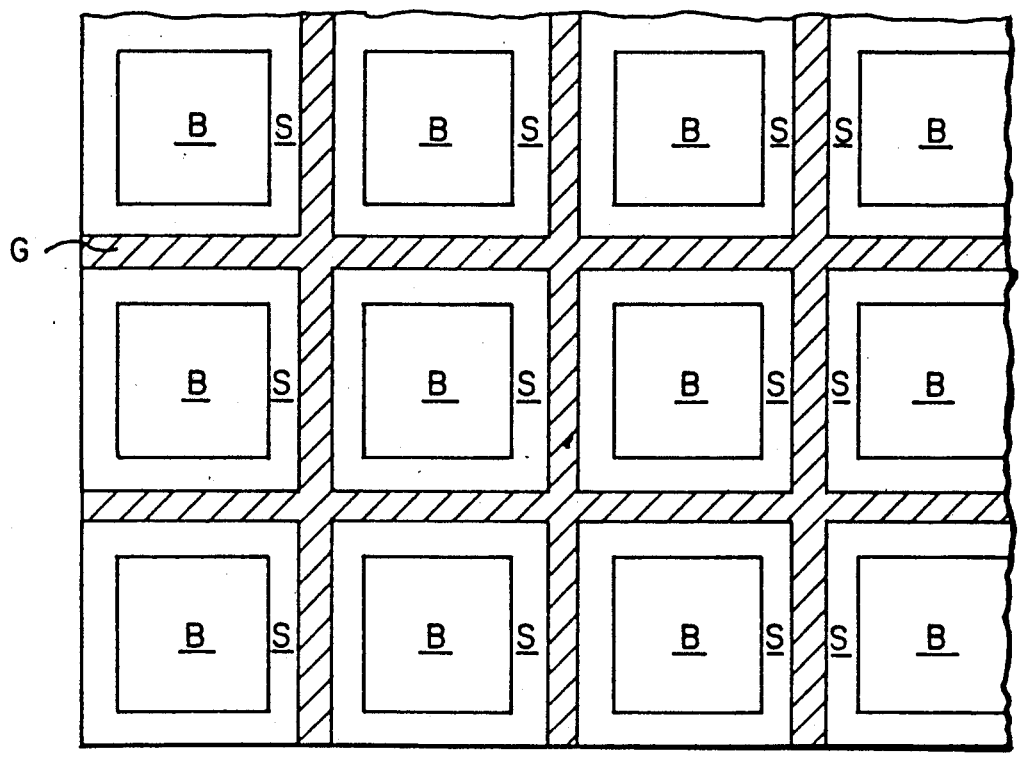
FIG._9

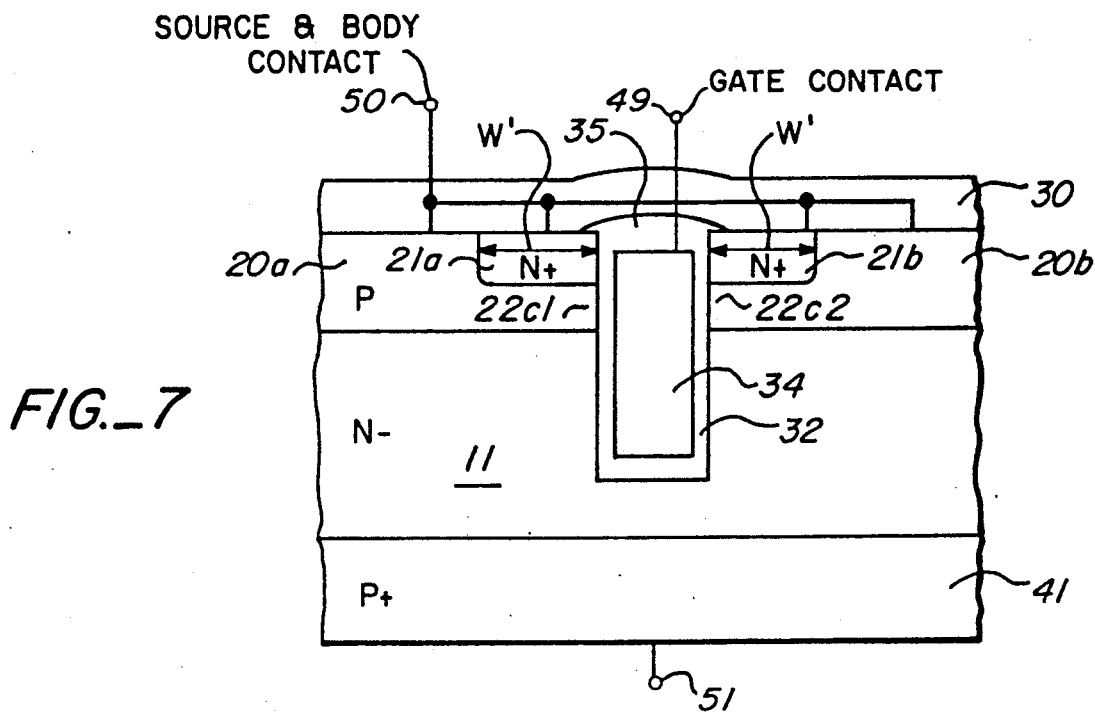
FIG._7
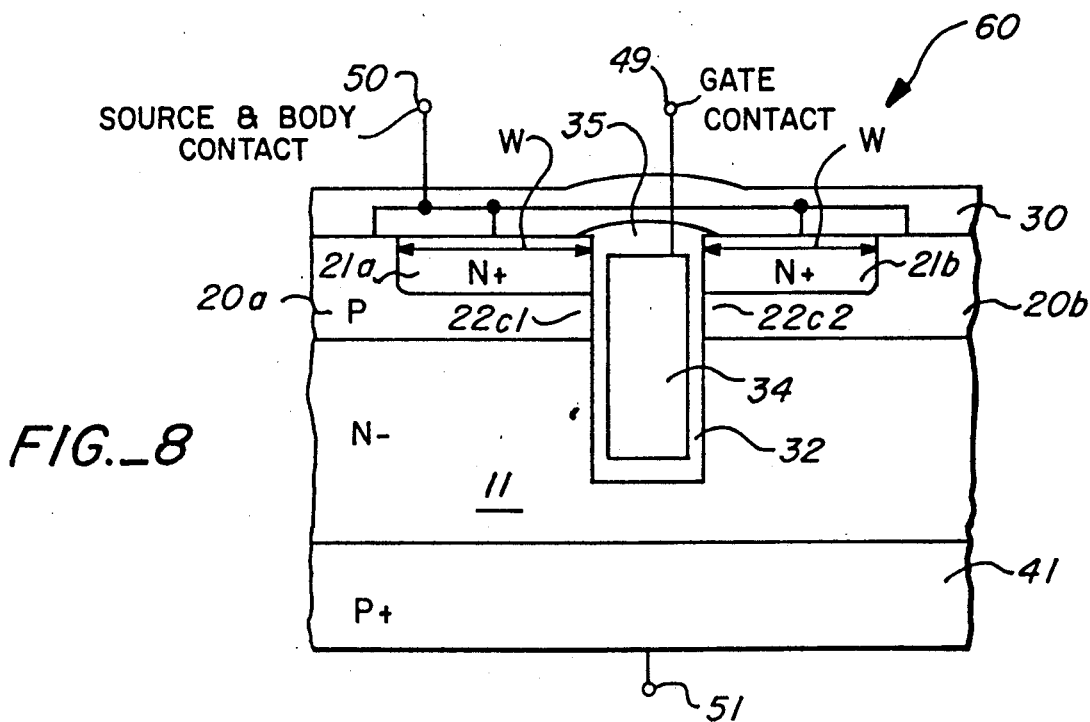
FIG._8

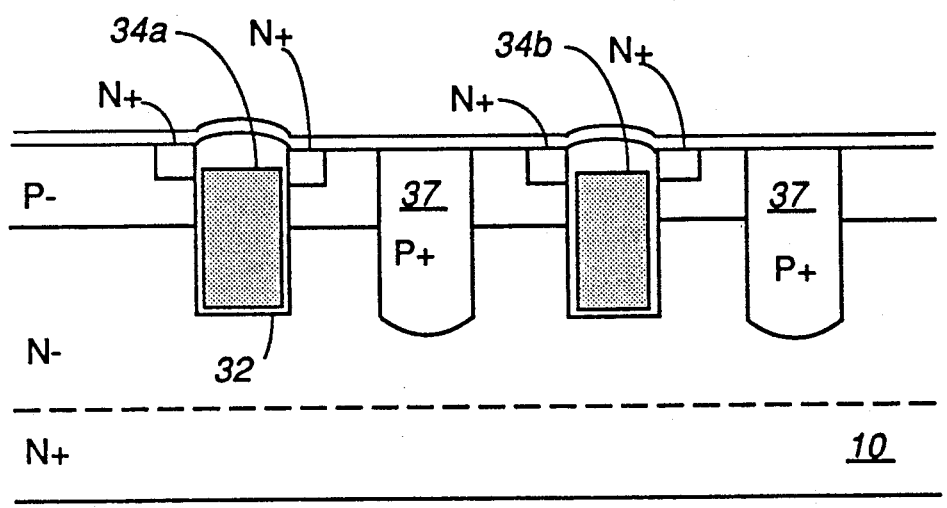
Fig._10

PLANAR VERTICAL CHANNEL DMOS STRUCTURE

This is a continuation-in-part application of U.S. patent application 06/929,685, filed Nov. 13, 1986, which is a divisional application of U.S. patent application 06/843,454, filed Mar. 24, 1986, now U.S. Pat. No. 4,767,722, issued Aug. 30, 1988.

FIELD OF THE INVENTION

This invention relates to a double diffused MOS (DMOS) transistor having a vertical channel region, and in particular to a planar DMOS transistor having a vertical gate.

BACKGROUND OF THE APPLICATION

Double diffused MOS (DMOS) transistors are well known in the prior art. For example, U.S. Pat. No. 4,344,081, issued to Pao et al. on Aug. 10, 1982, which is incorporated herein by reference, shows one such prior art structure. FIG. 1 shows a cross section of a prior art N-channel DMOS power transistor. This prior art structure includes an N− epitaxial layer 11 formed on an N+ silicon substrate 10. Gate oxide layer 16 is formed on epitaxial layer 11 and doped polysilicon gate 15 is formed on oxide layer 16. Oxide layer 9 covers gate 15. P-type body regions 12a and 12b are diffused into epitaxial layer 11, and N+ source regions 13a and 13b are diffused into body regions 12a and 12b, respectively. Source regions 13a and 13b are electrically tied to body regions 12a and 12b by metal contacts 18 and 19, respectively. Contacts 18 and 19 are also electrically tied together. Regions 12c1 and 12c2 beneath gate 15 in body regions 12a and 12b, respectively, are channel regions. When the potential between gate 15 and source regions 13a and 13b is sufficiently high and with a positive voltage on drain contact 17, carriers flow laterally from source regions 13a and 13b through channel regions 12a and 12b, respectively, to drain region 11 and then vertically downward through drain region 11 and N+ substrate 10 to drain contact 17, as indicated by arrows 20a and 20b in FIG. 1. P-channel DMOS transistors have a similar structure, but P-type and N-type regions are reversed, and a voltage of the opposite sign produces current flow.

As explained above, the carriers that flow in the prior art vertical DMOS transistors shown in FIG. 1 must change direction, first flowing laterally and then vertically. Carrier flow is more efficient if the source, body and drain regions are arranged vertically as shown in FIG. 2. FIG. 2 shows a cross section of a prior art DMOS transistor with a U shaped gate extending into the epitaxial layer. This structure is due to Ueda et al. and is explained in more detail in *A New Vertical Power MOSFET Structure with Extremely Reduced On-Resistance,* by Ueda, et al., IEEE TRANSACTIONS ON ELECTRON DEVICES, VOL. ED-32, NO. 1, January 1985, which is incorporated herein by reference. In this prior art structure N− epitaxial layer 11 is again formed on N+ substrate 10. A P-type dopant is diffused into epitaxial layer 11 and an N+-type dopant is diffused into a portion of the epitaxial layer that has been doped with a P-type dopant. Rectangular groove 23, having vertical walls, is then etched in the epitaxial layer using reactive ion beam etching, thereby creating P-type body regions 20a and 20b and corresponding N+ source regions 21a and 21b as shown in FIG. 2. Source regions 21a and 21b are electrically tied to body regions 20a and 20b, respectively, by metal contacts 18 and 19 which are also electrically tied together. A slight wet etch is then applied to smooth the surface of groove 23. Gate oxide 24 is formed in rectangular groove 23, and a U shaped polysilicon gate 25 is formed over gate oxide 24.

The prior art structure of FIG. 2 has the advantage that when the gate to source potential is sufficient to turn on the transistor, carriers flow vertically from N+ source regions 21a and 21b through channel regions 22c1 and 22c2 in body regions 20a and 20b, respectively, and continue to flow vertically downward through drain region 11 to N+ substrate 10 and drain contact 17. However, the structure of FIG. 2 has a disadvantage in that it is difficult to fabricate because it requires the formation of a U-shaped gate and results in a transistor with a nonplanar surface.

SUMMARY OF THE INVENTION

A DMOS device is disclosed which has a vertical gate and a planar surface. The device has a flat surface for all masking steps while still allowing contact to be made to the vertical gate.

In one embodiment, a DMOS power transistor is disclosed which has a drain region of a first conductivity type, a body region of a second conductivity type formed above the drain region, and a source region of first conductivity type. An upward opening rectangular groove extends downward through the source and body regions and into the drain region so that a first source region in a first body region lies on one side of the rectangular groove and a second source region in a second body region lies on the other side of the rectangular groove.

The upward opening rectangular groove is lined with an upward opening dielectric region which is filled with the gate region so that a vertical gate is formed having a top surface which lies between the first and second source regions. An insulating layer is then formed over the above structure so that a transistor with a planar surface is obtained In operation, carriers flow vertically between the source and drain regions.

In another embodiment, a semiconductor device having a vertical gate region is formed in a block of semiconductor material. The vertical gate region lies in an upward opening dielectric region which lines an upward opening rectangular groove. A source region of a first conductivity type is formed above a body region of a second conductivity type which lies above a drain region of a first conductivity type. The source, body and drain regions are all adjacent one vertical surface of the dielectric material. The top surface of the vertical gate region lies opposite the source region and the bottom surface of the gate region lies opposite the drain region. The second embodiment also includes an insulating layer formed over the gate, source and body regions resulting in a device with a planar top surface. Still other embodiments are described below.

BRIEF DESCRIPTION OF THE DRAWINGS

FIG. 1 shows a prior art N-channel DMOS transistor;

FIG. 2 shows a prior art DMOS transistor having vertical channel regions;

FIG. 3 shows one embodiment of the DMOS structure of the present invention;

FIGS. 4a through 4f show process steps in the formation of the transistor shown in FIG. 3;

FIG. 5 shows a second embodiment of the DMOS transistor of the present invention;

FIG. 6 shows a third embodiment of the DMOS transistor of the present invention;

FIG. 7 shows a cross-section of an insulated gate transistor formed according to the present invention;

FIG. 8 shows a cross-section of an MOS-gated silicon controlled rectifier formed according to the present invention;

FIG. 9 shows a top view of one surface geometry employed by the present invention; and FIG. 10 shows in cross-section a transistor in accordance with my invention including a deep body region.

DETAILED DESCRIPTION OF THE INVENTION

FIG. 3 shows one embodiment of the vertical gate planar DMOS power transistor of the present invention. The process sequence for fabricating this N-channel transistor is shown in FIGS. 4a-4f. In other embodiments, the vertical gate planar DMOS transistor of the present invention is a P-channel device.

Substrate 10 shown in FIG. 4a is a silicon wafer doped with N-type impurities so that its resistivity is within the range of 0.005 to 0.1 ohm-cm (in one embodiment, 0.02 ohm-cm). An N-type epitaxial layer 11 having a resistivity between 0.2 and 100 ohm-cm (in one embodiment, 2.4 ohm-cm) is then grown on substrate 10 to a thickness between 6 and 150 microns (in one embodiment, 13.5$\mu$). Substrate 10 and epitaxial layer 11 typically have a [100] crystal orientation.

A layer of dielectric material (not shown) is then formed over the wafer by heating the wafer in an oxygen atmosphere at about 900°-1200° C. to form a silicon dioxide layer approximately 1,000-10,000 Å thick over the surface of the wafer. Using standard photoresist techniques, a body mask pattern is transferred to the surface of the silicon dioxide layer which exposes those regions of the silicon dioxide layer through which ions are implanted to form P region 20. (In one version, no body mask is needed, and P-type dopant is implanted to form region 20.) In one embodiment, P region 20 is formed by implanting boron ions at a dosage between $10^{13}$ and $2 \times 10^{14}$ ions/cm$^2$ at an energy level between 40 and 120 KEV and then annealing the structure for approximately 4 to 12 hours in an atmosphere of oxygen or nitrogen. P region 20 typically ranges in depth from 2 to 4 microns. Alternatively, P region 20 may be formed using standard diffusion techniques.

After a source mask is applied to the wafer, the wafer may then be etched to thin or remove the silicon dioxide formed during the annealing process. (If the oxide formed after the body diffusion is not too thick, i.e., it does not block the implant, no thinning etch is needed.) An N-type ion implantation is performed using arsenic or phosphorus ions at a dosage between $5 \times 10^{14}$ and $1 \times 10^{16}$ ions/cm$^2$ using an implant energy of 50 to 150 KEV. The wafer is then annealed at a temperature of 900°-1200° C. for approximately 0.5 to 3 hours in an atmosphere of oxygen and nitrogen to form N+ source region 21 which typically ranges in depth from 1 to 2 microns.

The silicon dioxide layer 30 is formed during the above source drive-in. A gate groove mask (not shown) is applied, and the SiO$_2$ layer is etched using buffered HF.

As shown in FIG. 4b, rectangular groove 31 having vertical sidewalls is then etched using reactive ion beam etching or other etching technique which permits anisotropic etching regardless of crystallographic orientation. Groove 31 preferably has a width less than or equal to 2 $\mu$m and a depth between 3 $\mu$m and 10 $\mu$m. As shown in FIG. 4c, gate dielectric layer 32 is then formed over the surfaces of the groove 31. In one embodiment, gate dielectric layer 32 is silicon dioxide having a thickness in a range of 500-1000 Å and is formed by heating the wafer in an oxygen ambient containing water at a temperature of 900°-1100° C. for 0.5 to two hours (in another embodiment, insulating layer 32 is a combination of silicon dioxide and silicon nitride which is either grown or deposited). The gate dielectric forms an inner, upward opening, rectangular groove 31*.

Polysilicon layer 33 (shown in FIG. 4d) is then deposited using a low pressure chemical vapor deposition process (LPCVD) to a thickness sufficient to fill rectangular groove 31*. For example, if groove 31 is 1.5 microns wide and 6 microns deep, polycrystalline silicon layer 33 is deposited with a thickness of 1-2 $\mu$m. Polycrystalline silicon layer 33 is doped either during deposition or subsequent to deposition, typically using phosphorus, so that it has a sheet resistance of between 30 and 50 ohms/square. Alternatively, in another embodiment, layer 33 comprises a layer of silicide formed using conventional techniques to a depth sufficient to fill rectangular groove 31*.

Polycrystalline silicon layer 33 is then subjected to a CF$_4$ etch or another etch technique without using a mask in the trenched area, groove 31*, (except for a mask (not shown) which may be placed at any convenient point along the length of groove 31 in order to keep a contact pad (not shown) to the to-be-formed gate 34 shown in FIG. 4e) in order to remove the polycrystalline silicon not in groove 31*. The portion of polycrystalline silicon layer 33 remaining in groove 31* after the CF$_4$ etch is denoted by 34 in FIG. 4e and serves as the gate of the vertical DMOS transistor. The etch is continued until top surface 34a lies 0.25-0.5 $\mu$m below the top surface of layer 30. This top surface depth is controlled by etch time past clearing the field. The etch must be terminated so that gate 34 overlaps N+ regions 21a and 21b shown in FIG. 4f after the subsequent oxidizing step. The wafer is then oxidized in an atmosphere containing oxygen (which consumes a portion of polysilicon layer 33 in groove 31*) until the top surface of the oxidized portion 35 above gate 34 forms an essentially flat (planar) surface with the top surface of passivating layer 30 whose thickness may also be slightly increased during the formation of region 35. Of importance, the etch to form surface 34a must be terminated sufficiently soon so that after the oxidation which forms silicon dioxide layer 35, the top portion of gate 34 overlaps N+ source regions 21a and 21b (see FIG. 4f).

The above structure has a flat surface for all masking steps while still allowing contact to be made to the gate region. The source/body contact shown schematically in FIG. 3 is fabricated using prior art techniques, and in cross section typically appears as shown in FIG. 1.

When the gate-to-source potential is sufficiently high and with a positive potential on drain 17 (FIG. 3), electrons flow vertically from N+ source regions 21a and 21b through channel regions 22c1 and 22c2 in body regions 20a and 20b, respectively, and continue to flow vertically downward through drain 11 and N+ substrate (drain) 10 to drain contact 17.

Typically, many DMOS devices similar to the one shown in cross section in FIG. 3 are formed simultaneously. Layout efficiency varies with surface geometry. There is a wide variety of layouts. FIG. 9 shows a top view of one surface geometry employed by this invention, namely, a square source and body region on a square gate grid 35. In FIG. 9, S denotes the locations of the source regions, B the locations of the body regions, and G the locations of the gate regions. The dotted line shown in FIG. 9 corresponds to the cross section shown in FIG. 3. In another layout, (not shown) the gate and source and body regions are interdigitated. Another layout (not shown) has hexagonal source and body regions on an hexagonal gate grid. Still another layout employs square source and body regions on a hexagonal gate grid. The latter layout is more efficient than the others. Other source geometries include rectangles, circles and triangles.

The structure shown in FIG. 3 reduces the total area requirement from 30% to 50% below that of the Ueda device shown in FIG. 2.

FIG. 10 illustrates in cross-section an embodiment of my invention in which a P+ region 37 is formed between and extends lower than gate structures 34a and 34b. Deep body region 37 is provided for reasons described in U.S. Pat. No. 4,345,265, issued to Blanchard on Aug. 17, 1982 and incorporated herein by reference. Specifically P+ deep body region 37 is used to alter the breakdown characteristics of the transistor of FIG. 10. P+ region 37 can be formed by any conventional process, e.g., ion implantation prior to the formation of N+ region 21 (see FIG. 4a).

FIG. 5 shows a cross section of an alternate embodiment of the invention in which a P− epitaxial layer 40 is formed on substrate 10 in place of N− epitaxial layer 11 and in which gate 34 in groove 31 reaches through to the N+ substrate. In this embodiment the P− epitaxial layer serves as the body region of the transistor. This embodiment results in a transistor having a lower on resistance than the device shown in FIG. 4a by as much as a factor of 2 and a lower breakdown voltage (typically around 30 volts) than the device shown in FIG. 4a.

FIG. 6 shows another alternate embodiment of the invention which is similar to the embodiment shown in FIG. 4f except that groove 31 is formed sufficiently deep so that gate 34 extends completely through the epitaxial layer 11 and into substrate region 10. This alternate embodiment also has a lower on resistance and a lower breakdown voltage (typically about 30 volts) than the device shown in FIG. 4a. This is acceptable in low voltage applications, for example, low voltage motors and Schottky diode replacements.

The above description has been given in terms of DMOS transistors, but the invention also applies to other MOS-gated devices such as an MOS-gated SCR or a MOS-gated conductivity modulated device.

FIG. 7 shows a cross section of one embodiment for an insulated gate transistor. FIG. 8 shows a cross section of one embodiment for an MOS-gated silicon controlled rectifier.

The silicon controlled rectifier shown in FIG. 8 is fabricated in the same manner as explained above for the transistor shown in FIG. 3 in connection with FIGS. 4a through 4f except that the starting material is a silicon substrate 41 heavily doped with P-type material, for example doped with Boron to a resistivity of 0.01 ohm-cm.

In operation, silicon controlled rectifier 60 is switched on by appropriately biasing source/body terminal 50 (shown schematically in FIG. 8), which provides electrical contact to source regions 21a and 21b and body regions 20a and 20b, gate terminal 49, which contacts gate 34, and substrate contact 51. Gate contact 49 and substrate contact 51 are biased positive relative to source/body contact 50. MOSFET mode conduction is initiated by electrons flowing from source regions 21a and 21b through channel regions 22c1 and 22c2, respectively, to N− drain region 11.

Drain region 11 also serves as the base for the PNP bipolar (junction) transistors comprising emitter region 20a, base 11, and collector region 41; and emitter region 20b, base 11, and collector region 41, respectively. With substrate contact 51 biased positively with respect to source/body contact 50 and with electrons flowing into base 11, the bipolar transistors are triggered into conduction and may latch in the on state even when the gate bias is removed.

The insulated gate transistor shown in FIG. 7 is similar to the structure shown in FIG. 8 except that in order to suppress thyristor action, the IGT shown in FIG. 7 is designed with narrow N+ source regions 21a and 21b which reduce the lateral body resistance beneath the source regions. See *The Insulated Gate Transistor: A New Three-Terminal MOS-Controlled Bipolar Power Device*, IEEE Trans. on Electron Devices, Vol. ED-31 No. 6, June 1984, which is incorporated herein by reference. For example, the width w' of N+ source regions 21a and 21b in FIG. 7 is typically between 2 μm and 4 μm whereas the width w of N+ source regions 21a and 21b in FIG. 8 is typically between 6 μm and 8 μm. The doping profile of the body regions beneath source regions 21a and 21b in FIG. 7 is also selected to reduce lateral body resistance beneath source regions 21a and 21b. See Blanchard, U.S. Pat. No. 4,345,265, issued Aug. 17, 1982, which is incorporated herein by reference. A low lateral body resistance beneath source regions 21a and 21b in FIG. 7 prevents the NPN transistor formed by source regions 21a and 21b, body regions 22c1 and 22c2, and the N-type drain region 11 from becoming active. As long as this NPN bipolar transistor does not turn on, the regenerative action characteristic of an SCR does not occur.

The above embodiments are meant to be exemplary and not limiting. In view of the above disclosure, many modifications and substitutions will be obvious to one of average skill in the art without departing from the scope of the invention.

I claim:

1. A vertical gate semiconductor device comprising:
   a drain region of a first conductivity type;
   a body region of a second conductivity type opposite said first conductivity type overlaying said drain region, said body region having a first portion and a second portion, said second portion having a first top surface;
   a source region of said first conductivity type overlaying said first portion of said body region and having a second top surface substantially coplanar with said first top surface, said source region being separated from said drain region by said body region;
   a first dielectric region defining a groove extending downward through said source and said body regions and into said drain region;
   a gate region disposed in said groove and having a top surface depressed with respect to said second top surface of said source region, said gate region filling said groove at least up to a bottom of said source region;
a second dielectric region having a substantially planar top surface overlaying said gate region, the top surface of said second dielectric region being substantially coplanar with said first and second top surfaces; and
an electrically conductive region electrically contacting said source and body regions.

2. A device as in claim 1,
wherein each of said first and second top surfaces has a first part and a second part separated by said groove, and
wherein said electrically conductive region overlays said second dielectric region and electrically contacts the first and second parts of said first and second top surfaces.

3. A semiconductor device as in claim 2 wherein said source and said body regions are formed in an epitaxial layer having said first conductivity type.

4. A semiconductor device as in claim 2 wherein said drain region comprises a semiconductor substrate, said body region consists of an epitaxial layer formed on said substrate, and said gate region extends into said substrate.

5. A semiconductor device as in claim 2 wherein said drain region comprises a semiconductor substrate and a selected portion of an epitaxial layer formed on said semiconductor substrate and said gate region extends through said epitaxial portion of said drain region into said substrate.

6. A semiconductor device as in claim 2 further including a fourth region having said second conductivity type, said fourth region underlying said drain region, wherein said first portion of said body region, said drain region, and said fourth region comprise an emitter, base, and collector, respectively, of a junction transistor.

7. A semiconductor device as in claim 2 wherein a portion of said gate region extends out of said groove, a conductive layer electrically contacting said portion of said gate region.

8. A device as in claim 2, wherein said gate region completely fills said groove at least up to said source region.

9. An intermediary of a vertical gate semiconductor device comprising:
a block of semiconductor material having a top surface;
a first dielectric region defining a groove extending downward from said top surface into said block of semiconductor material;
a source region of a first conductivity type extending downward into said block of semiconductor material from said top surface and adjacent a first portion of said first dielectric region;
a body region of a second conductivity type opposite said first conductivity type extending downward from said top surface into said block of semiconductor material below said source region, said body region being adjacent a second portion of said first dielectric region;
a drain region of said first conductivity type in said block of semiconductor material, said drain region being adjacent and underlying said body region and being adjacent a third region of said first dielectric region;
a gate region having a top surface depressed with respect to the top surface of said block, said gate region being adjacent said second and third portions of said first dielectric region, said gate region filling a portion of said groove below a bottom of said source region; and
a second dielectric region having a planar top surface overlaying said gate region and said source region and being thicker over said gate region than over said source region.

10. An intermediary as in claim 9, wherein said gate region is adjacent a part of said first portion of said first dielectric region.

11. An intermediary as in claim 9, wherein each of said source and said body regions has a first portion and a second portion separated by said groove.

12. An intermediary as in claim 9 wherein said groove is rectangular.

13. An intermediary as in claim 9 further comprising a region of said second conductivity type underlying said drain region, wherein
a portion of said body region, a portion of said drain region and a portion of said region of said second conductivity type underlying said drain region comprise a junction transistor.

14. A vertical MOS transistor comprising a plurality of cells, each cell comprising:
a first region of semiconductor material of a first conductivity type;
a second region of semiconductor material of a second conductivity type formed on said first region;
a third region of said first conductivity type formed on said second region;
a groove extending through said third and second regions, said groove extending at least down to said first region;
a gate structure formed within said groove but insulated from said first, second and third regions, said gate structure completely filling at least the portion of said groove extending below a bottom of said third region;
an insulating layer formed over said gate structure, said insulating layer being substantially coplanar with the top surface of said third region;
means for electrically contacting the top surface of said third region; and
means for electrically contacting the bottom surface of said first region.

15. A vertical MOS transistor comprising:
a first region of semiconductor material of a first conductivity type;
a first plurality of semiconductor regions of a second conductivity type opposite said first conductivity type formed on said first region;
a second plurality of semiconductor regions of said first conductivity type, each region within said second plurality being formed on an associated region within said first plurality, each region within said second plurality and its associated region within said first plurality being separated from the other regions within said first and second pluralities by a groove, said groove laterally surrounding said first and second plurality of semiconductor regions;
a first insulating layer lining an interior of said groove;
a gate structure formed within said groove but insulated from said first region, said first plurality of semiconductor regions, and said second plurality of semiconductor regions by said first insulating layer, said gate structure laterally surrounding each region within said first plurality and each region within said second plurality, said gate structure completely filling at least the portion of said groove extending below a bottom of said second plurality of semiconductor regions; and a second insulating layer formed over said gate structure, said second insulating layer being substantially coplanar with a top surface of said second plurality of semiconductor regions.

16. Structure of claim 15 further comprising a conductive layer electrically contacting said second plurality of semiconductor regions and extending over said second insulating layer.

17. Structure of claim 16 wherein a top surface of said gate is recessed relative to the top surface of said second plurality of semiconductor regions.

18. Structure of claim 17 wherein said second insulating layer is thermally grown.

* * * * *